United States Patent [19]
Schwartzlow et al.

[11] Patent Number: 5,982,684
[45] Date of Patent: Nov. 9, 1999

[54] PARALLEL ACCESS TESTING OF A MEMORY ARRAY

[75] Inventors: John K. Schwartzlow; Tuan Do, both of Chandler, Ariz.

[73] Assignee: Intel Corporation, Santa Clara, Calif.

[21] Appl. No.: 09/086,330

[22] Filed: May 28, 1998

[51] Int. Cl.[6] ...................................................... G11C 7/00
[52] U.S. Cl. ............................................................ 365/201
[58] Field of Search ............................... 365/201, 230.03; 371/21.1

[56] References Cited

U.S. PATENT DOCUMENTS

| | | | |
|---|---|---|---|
| 4,868,823 | 9/1989 | White, Jr. et al. | 365/201 |
| 5,471,480 | 11/1995 | You | 365/201 |
| 5,673,270 | 9/1997 | Tsujimoto | 371/21.1 |
| 5,910,923 | 1/1999 | Brown et al. | 365/201 |

*Primary Examiner*—David Nelms
*Assistant Examiner*—Anh Phung
*Attorney, Agent, or Firm*—Blakely, Sokoloff, Taylor & Zafman LLP

[57] ABSTRACT

The present invention discloses a method and apparatus for testing a memory array. The memory array includes a plurality of memory blocks. A test data item is written to the memory blocks at a pre-determined location in parallel. The data from the memory blocks are read at the pre-determined location in parallel. These data items are compared to determine if they are identical. One of these data items is compared with the test data item.

27 Claims, 3 Drawing Sheets

PARALLEL ACCESS TESTING OF A MEMORY ARRAY

BACKGROUND OF THE INVENTION

1. Field of the Invention

This invention generally relates to device testing. In particular, the invention relates to testing of memory arrays.

2. Description of Related Art

Testing memory devices is usually a tedious process. In addition to timing and electrical tests, logic testing is necessary to ensure that the memory devices can store data reliably.

For random access memory (RAM), either static or dynamic, the logic testing usually includes a write cycle followed by a read cycle. A known test data item is written into a specified memory location. Then the contents of the memory at that specified location are read out. The read out contents are compared with the known test data item. If they match, the logic testing is successful. If they do not match, the memory device fails the test. The test procedure is then repeated for all memory locations.

A memory array that consists of a number of memory elements may be tested in a similar manner. Memory arrays are used in a memory module or in a single-chip microcomputer (e.g., a microcontroller). However, testing memory arrays through read/write cycling as above has a number of problems. Most significantly, the testing time is long because the write and read cycles have to be performed on every memory location. For large size memory arrays, testing each memory location in such a sequential manner is undesirable.

Therefore there is a need in the technology to provide an efficient and reliable test procedure for memory arrays.

SUMMARY OF THE INVENTION

The present invention discloses a method and apparatus for testing a memory array. The memory array includes a plurality of memory blocks. A test data item is written to the memory blocks at a pre-determined location in parallel. The data item from the memory blocks are read at the pre-determined location in parallel. These data items are compared to determine if they are identical. One of these data items is compared with the test data item.

BRIEF DESCRIPTION OF THE DRAWINGS

The features and advantages of the present invention will become apparent from the following detailed description of the present invention in which.

DESCRIPTION OF THE PRESENT INVENTION

The present invention discloses a method and apparatus for testing memory arrays. The memory elements in the memory array are tested in parallel through a parallel access testing circuit. The parallel access testing circuit provides the test data items to be written to the memory elements in parallel. Then, the data items are read out in parallel and compared with each other and with the known written data items. By accessing the memory elements in parallel, the time needed for testing the memory array is significantly reduced.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention. An active LOW signal activates its function when it is low. An active HIGH signal activates its function when it is high. An active LOW signal is asserted when it is low, and deasserted when it is high. An active HIGH signal is asserted when it is high, and deasserted when it is low.

Figure 1:
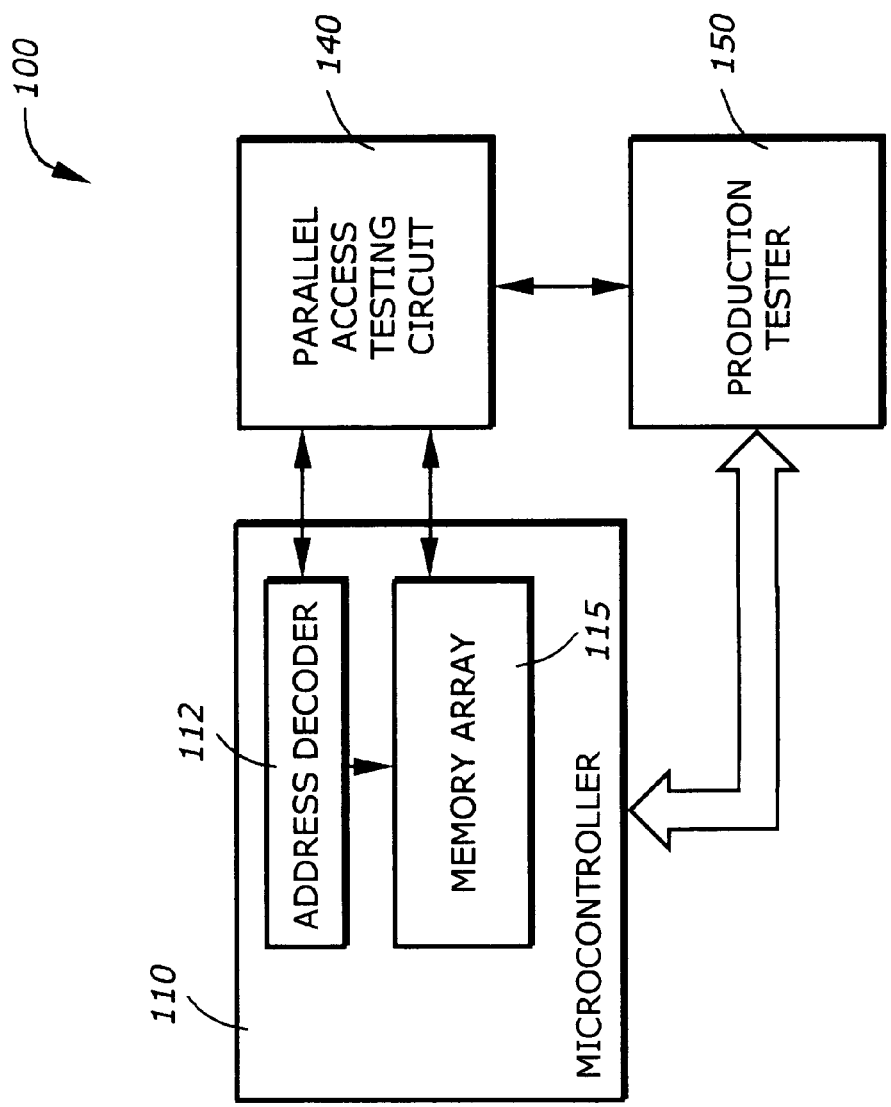
FIG. 1 is a diagram illustrating one embodiment of a system in accordance with the teachings of the invention.

FIG. 1 is a diagram illustrating one embodiment of a system 100 in accordance with the teachings of the invention. The system 100 includes a microcontroller 110, a parallel access testing (PAT) circuit 140, and a production tester 150. In this embodiment, the microcontroller 110 is the device under test. As is known by one skilled in the art, other embodiments are possible. For example, the device under test may be a memory module containing one or more memory arrays, or a microcontroller having an integrated memory array.

The microcontroller 110 includes an address decoder 112 and the memory array 115. During testing, the address decoder 112 receives the address from the parallel access testing circuit 140 and generates the address and enable signals to the memory array 115. The memory array 115 comprises a number of memory elements. In one embodiment, the memory array 115 has six 8K×8, where K refers to Kilo or 1024, static random access memory (SRAM) elements.

The parallel access testing (PAT) circuit 140 comprises an interface to the device under test, or the microcontroller 110, to access the memory elements.

The production tester 150 is any tester that tests the microcontroller 110. The production tester 150 has interface to the microcontroller 110 and the parallel access testing circuit 140. The production tester 150 performs tests other than logic testing for the memory array.

Figure 2:
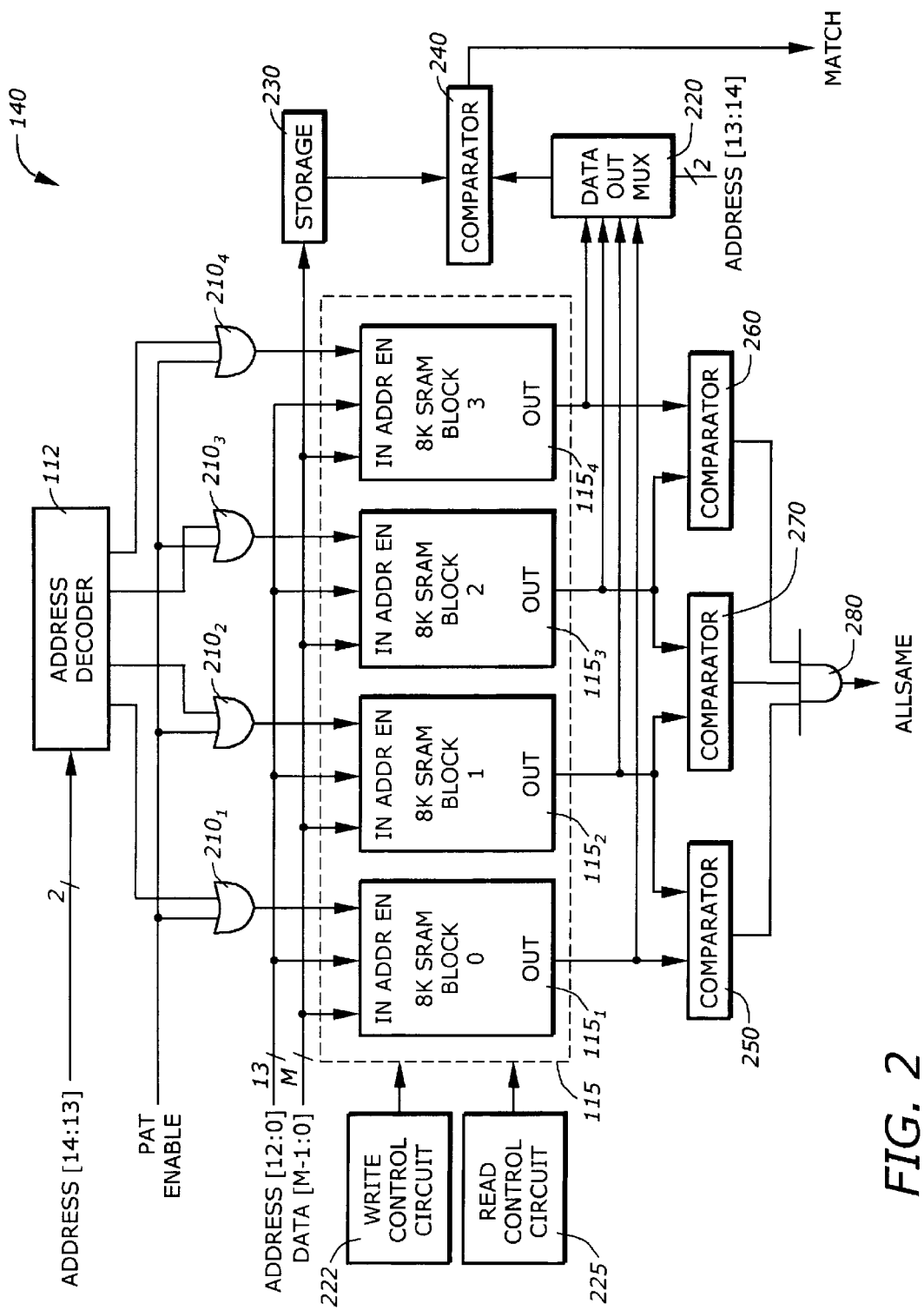
FIG. 2 is a diagram illustrating a parallel testing circuit according to one embodiment of the invention.

FIG. 2 is a diagram illustrating the PAT circuit 140 according to one embodiment of the invention. In this exemplary diagram, the memory array 115 has four (4) memory elements. As is known by one skilled in the art, any number of memory elements can be used. The PAT circuit 140 includes a address decoder 112 used for address decoder, four logic gates $210_1$ through $210_4$ functioning as OR gates, a write control circuit 222, a read control circuit 225, a storage element or data items latch 230, a data items out mux 220, comparators 240, 250, 260, and 270, and logic element 280. The PAT circuit 140 is interfaced to the memory array 115 via the address lines, ADDRESS[14:0], data items lines, DATA ITEMS[n−1:0], and enable lines.

The address decoder 112 receives the upper address lines to decode into the individual enable lines to the memory elements in the memory array 115. Typically a memory array having N, where N is a positive integer, memory blocks uses $\log_2 N$ address lines to decode into N enable lines which go to individual memory blocks. Usually, the address lines used for decoding are the most $\log_2 N$ significant address lines, although the decoding can work with any $\log_2 N$ address lines as long as the proper memory blocks are enabled. In the exemplary diagram of FIG. 2, the address decoder 112 receives the address lines A13 and A14 and decodes into four lines. The address decoder 112 may simply be a 2-to-4 decoder. Assuming active HIGH logic, the four decoder outputs are gated by four OR gates $210_1$ to $210_4$. For active LOW logic, the four OR gates are replaced by four AND gates. As is known by one skilled in the art, other gating schemes may be used. The gating signal is the PAT enable signal. This signal is asserted when the parallel access testing mode is selected. When the PAT enable signal is asserted HIGH, all four memory elements are enabled in parallel regardless of the decoder outputs.

The memory array 115 includes four memory blocks or elements $115_1$ to $115_4$. These memory blocks are organized as 8K×M, where "M" is the data items width. In this embodiment, M is 8, and the memory blocks are 8K×8. Each memory block has M data items input lines (IN), 13 address lines (ADDR), one enable line (EN), and M data items output lines (OUT). The IN and OUT data items lines may be combined in a bidirectional data items bus. The address lines to the four memory blocks are $A_0$ through $A_{12}$, ADDRESS[12:0], connected to the ADDR pins. The data items lines to the four memory blocks are denoted $D_0$ through $D_{n-1}$, DATA ITEMS[n-1:0], and are connected to the IN pins. In addition, in one embodiment the data items is latched by the data items latch 230. The data items latch 230 is any register that stores the data items written to the memory array. This data items will be used subsequently to compare with the data items read out from the memory array. In another embodiment, the data items latch 230 is merely a temporary storage, e.g., a variable, in a test program or a routine.

The write control circuit 222 generates the write enable signal to the memory array 115. This write enable signal is applied to all memory blocks in the memory array 115 in parallel. If the memory blocks have bi-directional data items bus, the write control circuit 222 also controls the switching of the data items buffers to the input direction. The read control circuit 225 generates the read enable signal to the memory array. This read enable signal is applied to all memory blocks in the memory array 115 in parallel. If the memory blocks have a bidirectional data items bus, the read control circuit 225 also controls the switching of the data items buffers to the output direction.

The data items out mux 220 selects one of the four outputs of the memory blocks. The selected data items will be compared with the data items stored in the storage element 230. The select lines are the two address lines A13 and A14, ADDRESS[14:13]. In parallel access testing mode, any of the memory blocks can be selected for comparison with the storage element 230. For individual block testing, the address lines A13 and A14 are used to select the data items out of the memory blocks for comparison. The data items as selected by the data items out mux 220 is compared with the data items latched at the data items latch 230 by the comparator 240. The comparator 240 is any identity or equality comparator. In one embodiment, the comparator 240 includes exclusive-OR gates followed by a NOR gate (for an active HIGH result) or an OR gate (for an active LOW result). The comparator 240 generates the output MATCH signal.

The data items out of the four memory blocks $115_1$ to $115_4$ are compared pairwise by three comparators 250, 260, and 270. As is known by one skilled in the art, the number of comparators depends on the number of memory blocks. The objective of the comparison is to determine if all output data items are the same. For four memory blocks, three comparators may be employed. For six memory blocks, five comparators are needed. Generally, or N memory blocks, the number of pairwise comparators is at most N−1. Comparator 250 compares the data items out of the memory blocks $115_1$ and $115_2$. Comparator 260 compares the data items out of the memory blocks $115_3$ and $115_4$. Comparator 270 compares the data items out of the memory blocks $115_2$ and $115_3$. Each of the comparators 250, 260, and 270 is an identity or equality comparator to determine if the two inputs are identical. In one embodiment, the comparator is implemented by exclusive-OR gates. Each of the comparators 250, 260, and 270 will generate an output to indicate if its two inputs are the same. In one embodiment, this output is active HIGH, i.e., the output is HIGH if the two inputs are the same and LOW otherwise.

The logic element 280 combines the results of the comparators and generate a composite output ALLSAME. The ALLSAME output is asserted if all outputs of the memory blocks are the same. If any one of the memory outputs is different than any of the other outputs, then the ALLSAME output is de-asserted.

When the ALLSAME output is asserted, indicating that all data items from the four memory blocks are the same, then any of the data items can be used to compare with the test data items which is latched at the data items latch 230. As discussed earlier, the data items latch 230 may represent a register, or any temporary storage element that holds the test data items such as a temporary variable in a test program or routine. In this way, the latch 230 functions like a virtual storage element. It is not necessary to wait for the ALLSAME output to be asserted before comparing any output with the latched data items. The data items out mux 220 can select any output and the comparison of this selected output and the data items latch 230 by the comparator 240 can be performed at the same time with the ALLSAME comparison.

When the ALLSAME output is de-asserted or negated, indicating that at least one data items of the memory blocks is different than the other memory blocks, the memory array fails the test. If the memory array is integral to the device under test, for example, if the memory array is part of the microcontroller, then a failure indication of the memory array also leads to a failure indication of the microcontroller. If the memory array is not integral to the device under test and consists of independent memory blocks, then it may be desirable to test which one of the memory blocks fails the test. This can be accomplished by reading the memory array one block at a time through the data items out mux 220.

Individual block testing can be accomplished by selecting appropriate data items from the memory array via the data items out mux 220.

The memory array passes the test if the ALLSAME and the MATCH output signals are both asserted, indicating that all data items read from the memory blocks are identical to the test data items. The memory array fails the test if the ALLSAME is de-asserted, or if the ALLSAME is asserted and the MATCH is de-asserted.

Figure 3:
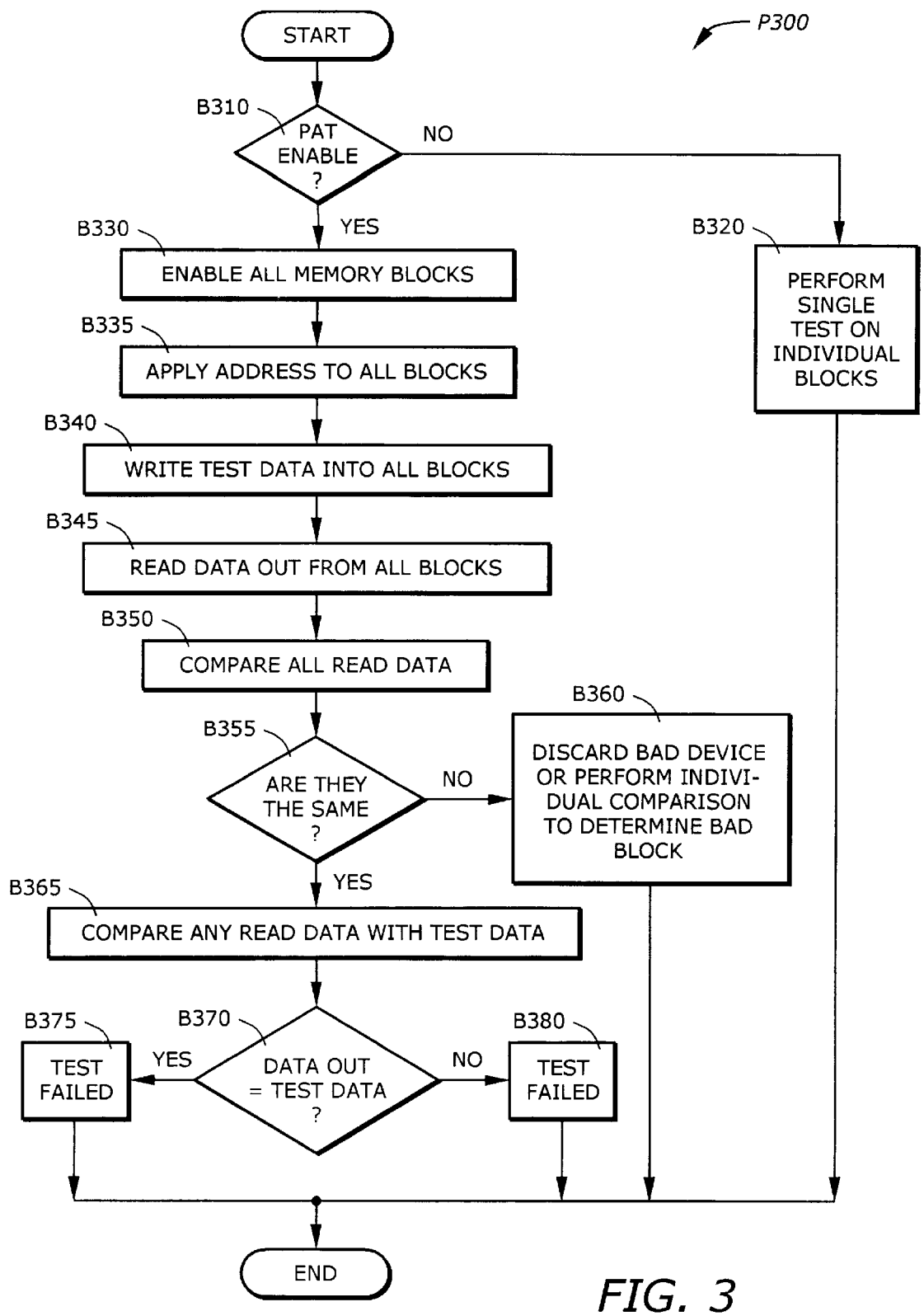
FIG. 3 is a flow diagram illustrating a process of the parallel access testing according to one embodiment of the invention.

FIG. 3 is a flow diagram illustrating a process P300 of the parallel access testing according to one embodiment of the invention. In general, the process P300 writes a test data items into each memory location, reads the written data items out, and compares the read data items with the test data items. As is known by one skilled in the art, it is also possible to write the test data items to all memory locations before reading out for all memory locations and performing comparisons.

At commencement, the process P300 determines if the parallel access testing (PAT) mode is enabled (B310). If NO, single tests are performed on the individual memory blocks (B320). If PAT mode is desired, all memory blocks are enabled (B330). All the memory blocks are enabled by asserting the PAT enable signal. Then, the memory address is applied to all blocks (B335). Next, the test data items is written into all the memory blocks (B340). At the same time, the test data items is stored in the storage element 230 for later comparison. After a write cycle, the contents of the memory blocks are read out at the addressed location (B345). The process P300 then compares all the data items read out from the memory blocks (B350).

Next, it is determined if all the read data items are the same (B355). If they are not the same, the process P300 discards the bad device or performs individual test on each memory block to determine which memory block is bad (B360). If all the read data items are the same, the process P300 compares any of the read data items with the test data items stored at the storage element 220 (B365).

It is determined if the selected data items is the same as the test data items (B370). If NO, the process P300 indicates that the test has failed (B380). If YES, the process P300 indicates that the test has passed (B375). The process P300 is then terminated.

The present invention provides an efficient technique for parallel access testing of a memory array. The memory blocks in the memory array are written and read out in parallel. The parallel access testing accelerates the testing time significantly.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method for testing a memory array including a plurality of memory blocks, the method comprising:
    writing a test data item to the plurality of memory blocks at a pre-determined location in parallel;
    reading data items from the plurality of memory blocks at the pre-determined location in parallel;
    determining if the data items read from the plurality of memory blocks at the pre-determined location are identical; and
    comparing one of the data items read from the plurality of memory blocks with the test data item.

2. The method of claim 1, before writing a test data item, further comprises enabling the plurality of memory blocks in parallel.

3. The method of claim 1 wherein the memory array has N memory blocks and determining if N data items read from N memory blocks are identical comprises:
    comparing N data items pairwise in parallel by at most N−1 comparisons; and
    combining the at most N−1 comparisons to produce a combined result.

4. The method of claim 1 further comprising storing the test data in a storage element before reading.

5. The method of claim 4 wherein comparing one of the N data read from N memory blocks with the test data comprises:
    multiplexing N data to produce a selected data; and
    comparing the selected data with the test data stored in the storage element.

6. The method of claim 1 wherein enabling comprises asserting a parallel access test (PAT) mode signal.

7. The method of claim 6 wherein the PAT mode signal is ORed with a plurality of decoded enable lines of the memory array.

8. The method of claim 7 wherein the memory array has N address lines and the N decoded enable lines are decoded from $\log_2 N$ significant address lines of the memory array.

9. The method of claim 3 wherein testing the memory array is successful if the combined result indicates that the data items read from the memory blocks are identical and one of the data items is identical to the test data item.

10. The method of claim 3 wherein testing the memory array is unsuccessful if the combined result indicates that the data items read from N memory blocks are not identical or one of the data items is different than the test data item.

11. An apparatus for parallel testing a memory array including a plurality of memory blocks, the apparatus comprising:
    a write circuit coupled to the memory blocks to write a test data item to the memory blocks at a predetermined location in parallel;
    a read circuit coupled to the memory blocks to read the data items from the memory blocks at the predetermined location in parallel;
    a first comparator circuit coupled to the memory blocks to determine if the data items read from the memory blocks are identical; and
    a second comparator circuit coupled to the memory blocks to compare one of the data items read from the memory blocks with the test data item.

12. The apparatus of claim 11 further comprises an enabling circuit coupled to the memory blocks to enable the memory blocks in parallel.

13. The apparatus of claim 11 wherein the memory array has N memory blocks and the first comparator circuit comprises:
    at most N−1 comparators to compare N data items pairwise, the at most N−1 comparators generating at most N−1 comparison outputs; and
    a combining element coupled to the at most N−1 comparators to combine the at most N−1 comparison outputs to produce a combined result.

14. The apparatus of claim 11 wherein the memory array has N memory blocks and the second comparator circuit comprises:
    a storage element to store the test data item;
    a multiplexer coupled to N memory blocks to multiplex N data items to produce a selected data item; and
    a comparator coupled to the multiplexer to compare the selected data items with the test data item stored in the storage element.

15. The apparatus of claim 11 wherein the memory array is included in a microcontroller.

16. The apparatus of claim 11 wherein the enabling circuit asserts a parallel access test (PAT) mode signal.

17. The apparatus of claim 16 wherein the PAT mode signal is ORed with a plurality of decoded enable lines of the memory array.

18. The apparatus of claim 17 wherein the memory array has N address lines the plurality of decoded enable lines are decoded from $\log_2 N$ significant address lines of the memory array.

19. The apparatus of claim 12 wherein testing the memory array is successful if the combined result indicates that the data items read from the memory blocks are identical and one of the data items is identical to the test data item.

20. The apparatus of claim 12 wherein testing the memory array is unsuccessful if the combined result indicates that the data items read from the memory blocks are not identical or one of the data items is different than the test data item.

21. A system comprising:

a memory array having a plurality of memory blocks; and a test circuit coupled to the memory array for testing memory data items, the test circuit comprising:

an enabling circuit for enabling the memory blocks in parallel, a write circuit coupled to the memory blocks to write a test data item to the memory blocks at a predetermined location in parallel, a read circuit coupled to the memory blocks to read data items from the memory blocks at the predetermined location in parallel, a first comparator circuit coupled to the memory blocks to determinine if the data items read from the memory blocks are identical, and a second comparator circuit coupled to the memory blocks to compare one of the data items read from the memory blocks with the test data item.

22. The system of claim 21 wherein the memory array has N memory blocks and the first comparator circuit comprises:

at most N−1 comparators to compare N data items pairwise, the at most N−1 comparators generating at most N−1 comparison outputs; and a combining element coupled to the at most N−1 comparators to combine the at most N−1 comparison outputs to produce a combined result.

23. The system of claim 21 wherein the memory array has N memory blocks and the second comparator circuit comprises:

a storage element for storing the test data item;

a multiplexer coupled to N memory blocks to multiplex N data items to produce a selected data item; and a comparator coupled to the multiplexer to compare the selected data items with the test data item stored in the storage element.

24. The system of claim 21 wherein the memory array is included in a microcontroller.

25. The system of claim 21 wherein the enabling circuit asserts a parallel access test (PAT) mode signal.

26. The system of claim 25 wherein the memory array has N address lines and the PAT mode signal is ORed with a plurality of decoded enable lines of the memory array.

27. The system of claim 26 wherein the N decoded enable lines are decoded from $\log_2 N$ significant address lines of the memory array.

* * * * *